United States Patent
Figueroa et al.

(10) Patent No.: US 7,063,569 B2
(45) Date of Patent: Jun. 20, 2006

(54) COAXIAL DUAL PIN SOCKETS FOR HIGH SPEED I/O APPLICATIONS

(75) Inventors: David G. Figueroa, Mesa, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/704,649

(22) Filed: Nov. 12, 2003

(65) Prior Publication Data

US 2004/0185714 A1     Sep. 23, 2004

Related U.S. Application Data

(63) Continuation of application No. 10/023,834, filed on Dec. 21, 2001, now Pat. No. 6,780,057.

(51) Int. Cl.
*H01R 13/648* (2006.01)
(52) U.S. Cl. .................................... 439/608
(58) Field of Classification Search ............... 439/608, 439/63, 579, 581, 609, 70
See application file for complete search history.

(56) References Cited

U.S. PATENT DOCUMENTS

| | | | |
|---|---|---|---|
| 6,164,999 A | | 12/2000 | McCutchan et al. |
| 6,368,121 B1 * | | 4/2002 | Ueno et al. ................. 439/108 |
| 6,853,559 B1 * | | 2/2005 | Panella et al. .............. 361/764 |

* cited by examiner

*Primary Examiner*—Javaid H. Nasri
(74) *Attorney, Agent, or Firm*—Erik R. Nordstrom

(57) ABSTRACT

A socket and fabrication method provide enhanced performance. The socket includes a base, and a plurality of signal contacts disposed within the base. A grounding fence is also disposed within the base such that the grounding fence laterally isolates the signal contacts from one another. The use of a grounding fence therefore enables elimination or significant reduction of ground contacts and therefore provides more signaling opportunities for a given amount of real estate.

13 Claims, 5 Drawing Sheets

COAXIAL DUAL PIN SOCKETS FOR HIGH SPEED I/O APPLICATIONS

CROSS-REFERENCE TO RELATED APPLICATIONS

This application is a continuation of application Ser. No. 10/023,834 filed on Dec. 21, 2001, now U.S. Pat. No. 6,780,057.

BACKGROUND OF THE INVENTION

1. Technical Field

The present invention generally relates to printed wiring board sockets. More particularly, the invention relates to a socket having a grounding fence for enhanced performance.

2. Discussion

In the highly competitive computer industry, the trend toward higher processing speeds and increased functionality is well documented. While this trend is desirable to the consumer, it presents significant challenges to circuit designers as well as manufacturers. A particular area of concern relates to the socket that often provides interconnection between the semiconductor package and the printed wiring board (PWB). The socket enables an integrated circuit (IC) such as a computer processor to communicate with other components resident on the motherboard such as the main system memory, the basic input and output system (BIOS) and the motherboard chipset itself. While a number of sockets and slots have been developed over the years in order to facilitate this interconnection, the increasing speed of input/output (I/O) signaling in processor applications has presented a number of difficulties to industry participants.

One particular difficulty relates to crosstalk, which can result from electromagnetic interference (EMI) between I/O pins. While the conventional approach to reducing crosstalk has been to increase the number of ground pins, this solution reduces the number of pins available for signal transmission for a given amount of real estate. Thus, the conventional solution has been to increase the total number of socket pins in order to maintain a minimum signal pin to ground pin (S/G) ratio. Such an approach can be costly not only in terms of actual dollar cost for the extra pins, but also for the real estate needed for the extra pins. FIG. 7 shows a conventional socket 10 wherein a base 12 has a plurality of signal contacts 14 and a plurality of ground contacts 16. It will be appreciated that typically a great deal of attention is paid to the arrangement and allocation of ground contacts 16 verses signal contacts 14. In order to reduce the effects of crosstalk, "ground bounce" and other performance related phenomena.

BRIEF DESCRIPTION OF THE DRAWINGS

The various advantages of the present invention will become apparent to one skilled in the art by reading the following specification and appended claims, and by referencing the following drawings, in which:

DETAILED DESCRIPTION

Embodiments provide a socket and fabrication method with enhanced performance. The socket includes a base, and a plurality of signal contacts disposed within the base. A grounding fence is also disposed within the base such that the grounding fence laterally isolates the signal contacts from one another. The use of a grounding fence therefore enables elimination or significant reduction of ground contacts and therefore provides more signaling opportunities for a given amount of real estate.

In another embodiment, a grounding fence includes a plurality of electrically conductive wall members and an interconnection structure. The interconnection structure is coupled to one or more of the wall members, where the interconnection structure enables electrical contact between the grounding fence and a ground plane of an adjacent printed wiring board (PWB). The wall members have surfaces defining a plurality of contact apertures such that the contact apertures encompass a plurality of signal contacts.

Further in accordance with exemplary embodiments, a method of fabricating a socket involves providing a base and disposing a plurality of signal contacts within the base. A grounding fence is disposed within the base such that the grounding fence laterally isolates the signal contacts from one another.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
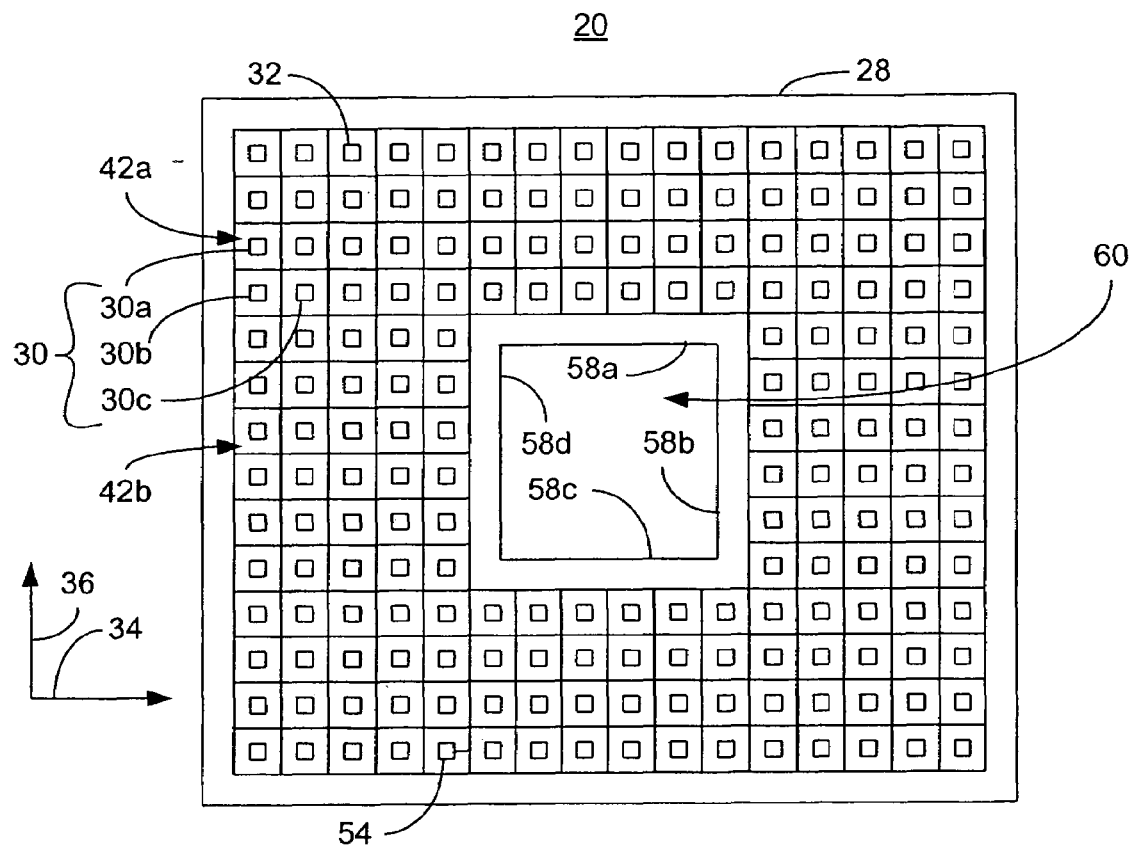
FIG. 1 is a plan of a view of an example of a socket in accordance with one embodiment of the present invention.
Figure 3:
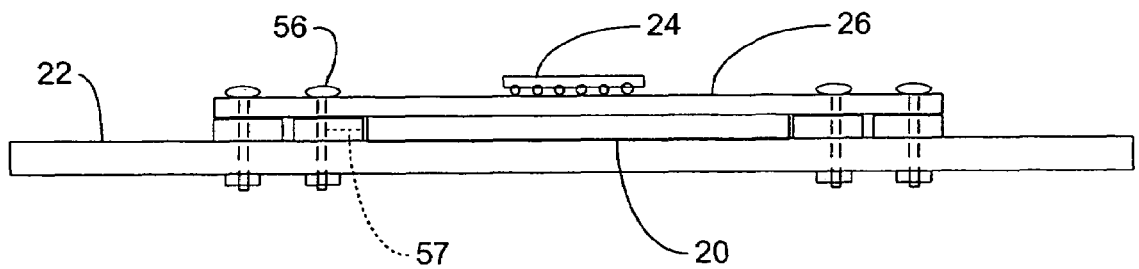
FIG. 3 is a side view of an example of a socket assembly in accordance with one embodiment of the present invention.

Turning now to FIGS. 1 and 3, a socket 20 is shown in accordance with one embodiment of the present invention. Generally, the socket 20 provides a mechanism for electrically interconnecting a PWB such as motherboard 22 to a semiconductor package, which includes semiconductor die 24 and flip chip pin gate array (FCPGA) structure 26. While in the illustrated example, the die 24 is connected with the FCPGA structure 26 in accordance with well documented controlled collapsed chip connection (C4) techniques, the invention is not limited to any particular type of semiconductor package. In fact, other packaging approaches such as wire bonding may be used without parting from the nature and scope of the invention.

Furthermore, although the invention will be primarily discussed as it relates pin-based mating arrangements between the socket 20 and the semiconductor package, other mating arrangements such as ball grid array (BGA) and land grid array (LGA) arrangements can benefit from the principles describe herein. Notwithstanding, there are a number of aspects of pin-based mating arrangements for which the socket 20 is uniquely suited.

Figure 6:
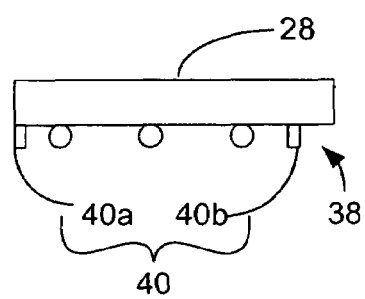
FIG. 6 is an enlarged side view of an example of an interconnection structure in accordance with one embodiment of the present invention.
Figure 2:
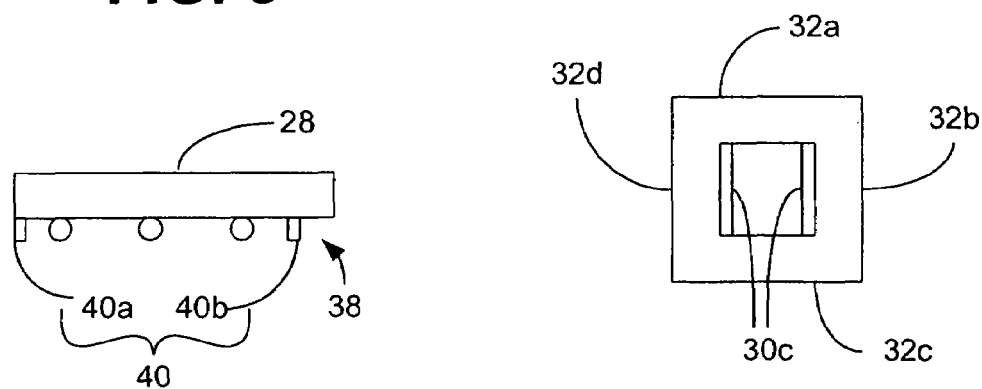
FIG. 2 is an enlarged view of an example of a contact aperture in accordance with one embodiment of the present invention.

It can be seen that the socket 20 has a base 28 and a plurality of signal contacts 30 disposed within the base 28. A grounding fence 32 is disposed within the base 28 such that the grounding fence 32 laterally isolates two or more of the signal contacts 30 from one another. Thus, the signal contacts 30 are provided with shielding defined by the grounding fence 32 in lateral directions 34, 36. The enlarged view shown in FIG. 2 illustrates that the grounding fence 32 preferably includes a plurality of electrically conductive wall members 32a–32d and FIG. 6 shows an interconnection structure 38 coupled to one or more of the wall members. The wall members 32a–32d are preferably made of a material that can be readily formed and manipulated into the desired configuration. One such material is aluminum, which can be stamped, welded or soldered as necessary.

It will be appreciated that the interconnection structure 38 enables contact between the grounding fence 32 and a ground plane of the motherboard 22 (FIG. 3). Specifically, one approach to the interconnection structure 38 is to extend a plurality of metal feet 40 from a board side of the grounding fence 32. The metal feet 40 can be formed as part of the grounding fence 32, or may be soldered or welded to the grounding fence 32. In one embodiment the metal feet 40 have a spacing that is less than a quarter wavelength of a predetermined operating frequency in order to minimize the effects of EMI between the socket 20 and the PWB 22. In the example of a computer processor application operating at one gigahertz, it has been determined that the third harmonic is the frequency of most interest. Thus, the spacing would be selected in accordance with well documented Faraday cage electromagnetic shielding techniques with the third harmonic in mind. Although the metal feet 40 are shown as having a through-hole architecture, which is more suitable for wave soldering, it will be appreciated that a surface mount technology (SMT) architecture would enable a reflow soldering process to be used. Since the socket 20 is shown as also having an SMT architecture, the assembly process could be simplified under such an approach. The metal feet 40 can therefore have C4 or BGA bumps at the ends for connection to corresponding contact pads on the PWB 22.

It should also be noted that the signal contacts 30 can have any number of commercially available structures. Thus, while the mating surfaces of the signal contacts 30 are shown as having a pin-based mating arrangement, BGA or LGA contacts can be used. Furthermore, although the illustrated signal contacts 30 extend into the pin region, other approaches such as bottom mating contacts are available.

Figure 4:
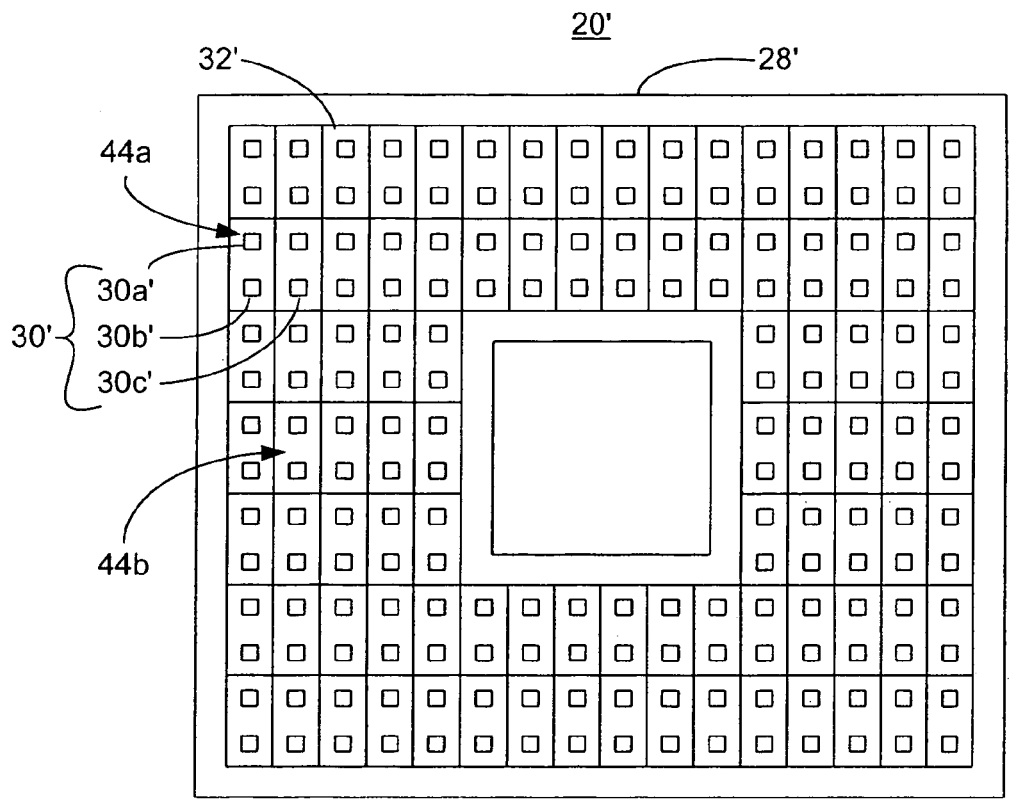
FIG. 4 is a plan view of an example of a socket in accordance with a first alternative embodiment of the present invention.
Figure 5:
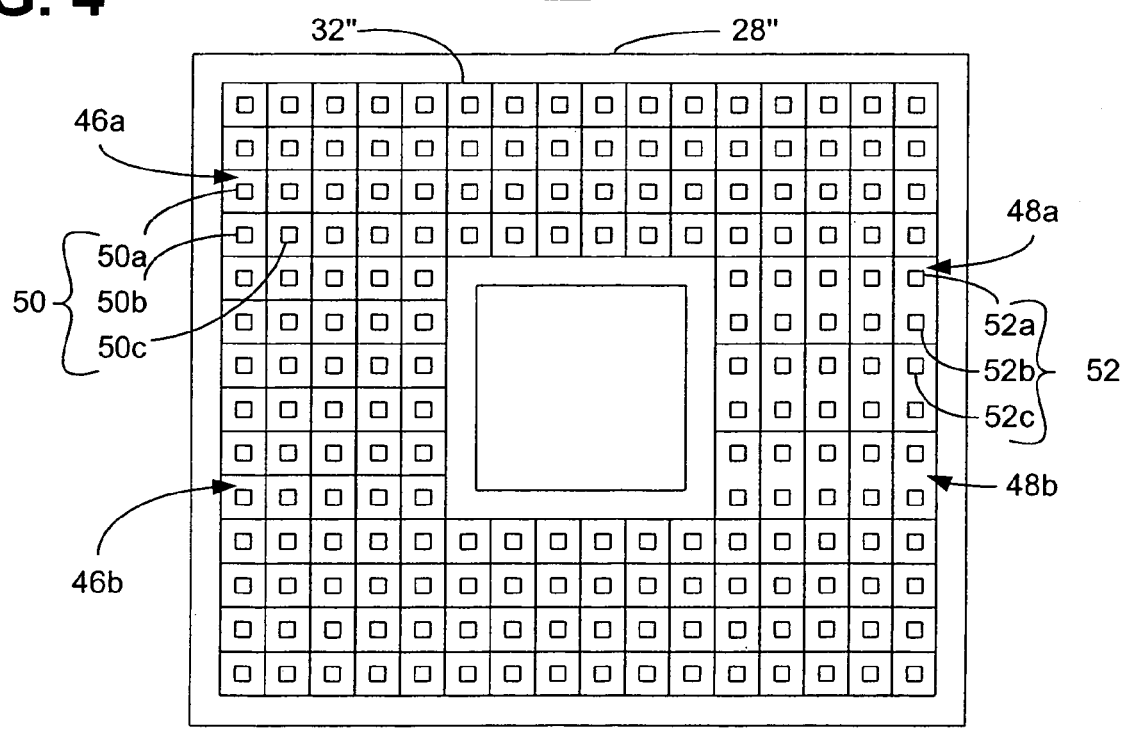
FIG. 5 is a plan view of an example of a socket in accordance with a second alternative embodiment of the present invention.
Figure 7:
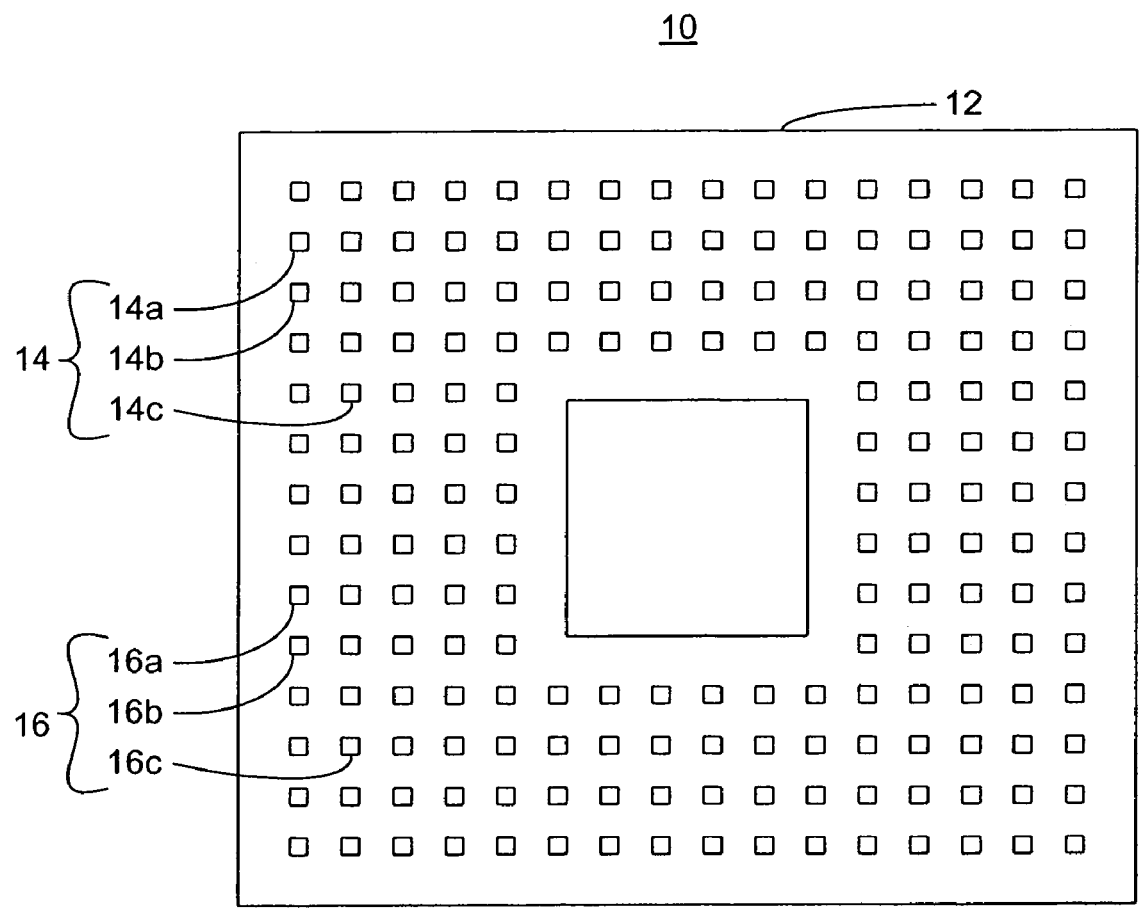
FIG. 7 is a plan view of an example of a conventional socket, useful in understanding the invention.

Turning now to FIGS. 1, 4 and 5, it can be seen that the present invention provides for single-ended signaling support, differential signaling support and any combination thereof. Specifically, FIG. 4 shows a socket 20' wherein each contact aperture 44 encompasses at least two of the signal contacts 30' such that the grounding fence supports differential signaling. It will be appreciated that differential signaling involves the use of a pair of signals traveling in opposite directions on adjacent paths. The effective result is numerous coaxial dual transmission lines that are well shielded and provide constant differential impedance in order to avoid impedance mismatching. Thus, differential signaling is known to result in enhanced noise rejection and enable the transmission of higher frequencies. By contrast, it can be seen that in the socket 20 shown in FIG. 1, each contact aperture 42 encompasses at least one of the signal contacts 30 such that the grounding fence 32 supports signal-ended signaling. Under this approach, each signal may independently take on a high or low value at any given moment in time.

With specific reference to FIG. 5, it can be seen that another approach is to provide a hybrid of the above-described approaches. Thus, the grounding fence 32" of socket 20" has a first set of contact apertures 46 and a second set of contact apertures 48. In the first set 46 each contact aperture encompasses at least one of the signal contacts 50. On the other hand, in the second set 48 each contact aperture encompasses at least two of the signal contacts 52.

Returning now to FIG. 1, it can be further be seen that one approach to completing the ground connection is to dispose one or more ground contacts 54 within the base 28. Thus, the ground contact 54 can be electrically coupled or "shorted" to the grounding fence 32 by a wire, solder ball or other interconnection mechanism. It will be appreciated, however, that an infinite signal pin to ground pin ratio (S/G) can be achieved by using a side-connected shunt 56 (FIG. 3). The shunt 56 connects the ground plane of the FCPGA structure 26 to the ground plane of the PWB 22. A shorting mechanism 57 electrically connects the shunt 56 to one of the perimeter wall members of the grounding fence 32. It can be seen that this approach enables all of the contacts within the socket 20 to be used for signaling purposes.

It will further be appreciated that the base 28 can be made up of any type of appropriate dielectric material. For example, the base 28 may result from a plastics injection molding process in which the grounding fence 32 is made to be part of the mold. It can further be seen that the base 28 has surfaces 58a–d defining a clearance aperture 60, where the clearance aperture 60 provides clearance space for capacitors (not shown) coupled to the adjacent FCPGA structure 26.

Figure 8:
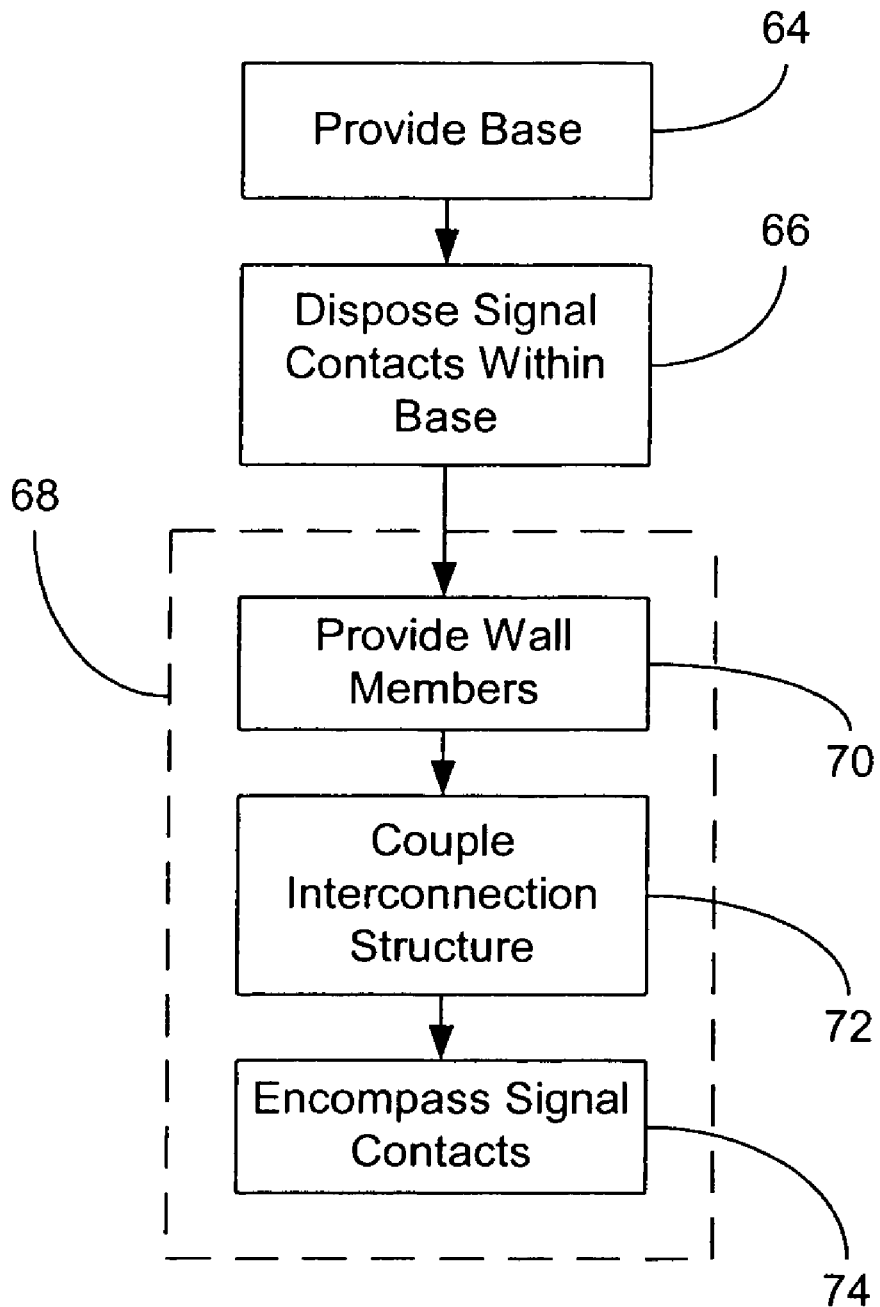
FIG. 8 is a flowchart of an example of a method of fabricating a socket in accordance with one embodiment of the present invention.

Turning now to FIG. 8, a method 62 of fabricating a socket is shown. It can be seen that a base is provided for at processing block 64 and a plurality of signal contacts are disposed within the base at block 66. Generally, processing the block 68 provides for disposing of a grounding fence within the base such that the grounding fence laterally isolates the signal contacts from one another. In the illustrated approach given as an example, this is achieved by providing a plurality of electrically conducted wall members at block 70. Processing block 72 provides for coupling an interconnection structure to one or more of the wall members, where the interconnection structure enables electrical contact between the grounding fence and a ground plane of an adjacent PWB. Block 74 demonstrates that the wall members have surfaces defining a plurality of contact apertures such that the contact apertures encompass the signals contacts. It is important to note that the processing steps described herein need not be performed in the order shown. For example, manufacturing considerations may dictate that the grounding fence be disposed within the base before, or at the same time as the signal contacts. In some embodiments, a single molding operation results in the final socket structure.

Figure 9:
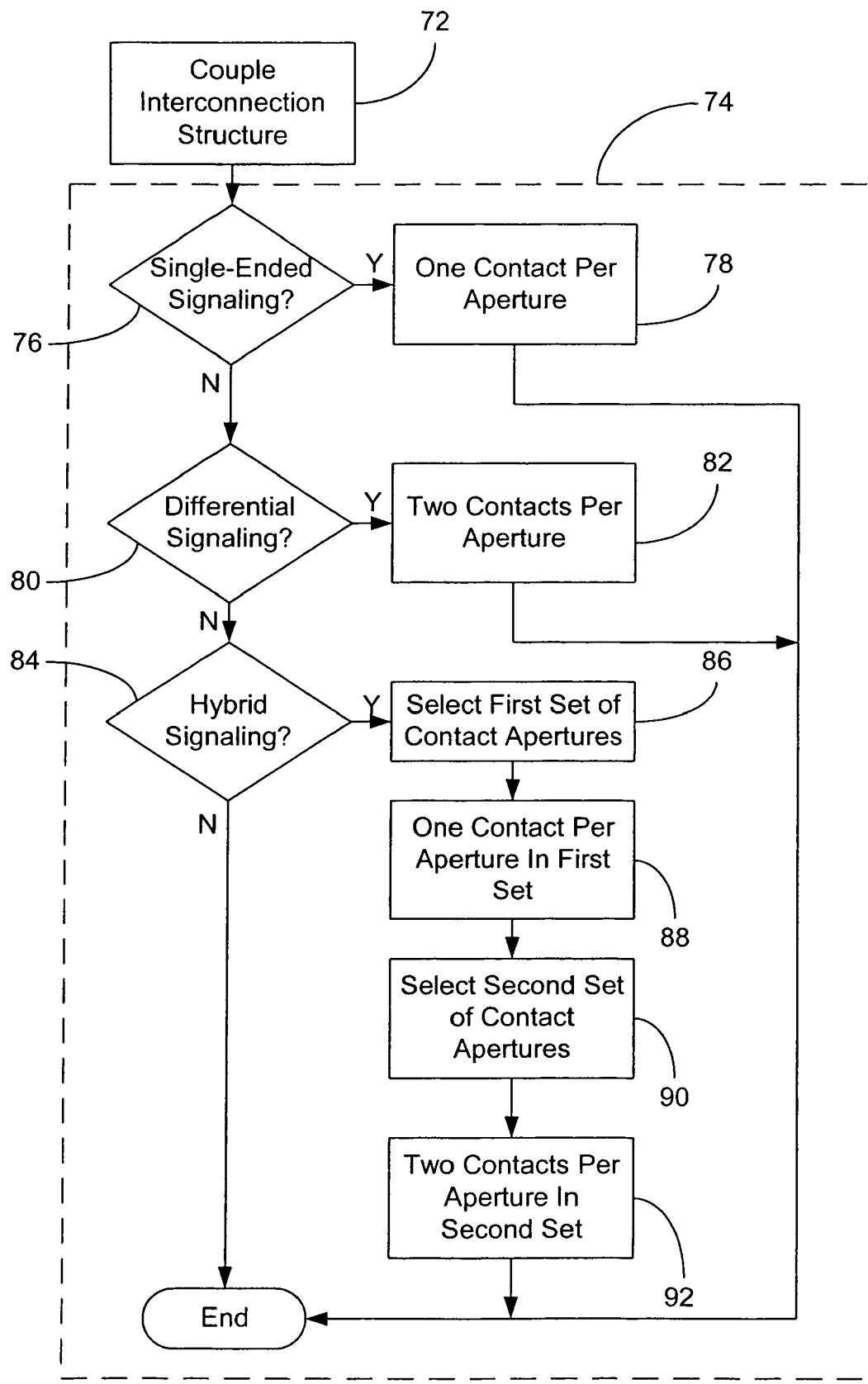
FIG. 9 is a flowchart of an example of a method of encompassing signal contacts with contact apertures in accordance with one embodiment of the present invention.

FIG. 9 demonstrates that the grounding fence can be designed to support single-ended, differential, or hybrid signaling. For example, if it is determined that single-ended signaling is desired at processing block 76, one of the signal contacts is encompassed with each contact aperture at block 78. On the other hand, if it is determined that differential signaling is desired at block 80, two of the signal contacts are encompassed with each contact aperture at block 82. It can be further seen that processing block 84 provides for determining whether hybrid signaling is desired and, if so, selecting a first set of contact apertures at block 86. One of the signal contacts is encompassed with each contact aperture in the first set at block 88 such that the socket supports single-ended signaling. In the case of hybrid signaling, a second set of contact apertures is selected at block 90, and two of the signal contacts are encompassed with each contact aperture of the second set at block 92. Thus, the resulting socket supports differential signaling as well as single-ended signaling.

It will therefore be appreciated that the grounding fence forms an improved shield for diminishing impedance mismatching, eliminating differential crosstalk between socket pins, and reducing electromagnetic radiation from the socket. All contacts can be used for signal transmission, no ground contacts are needed, and the S/G ratio can be made to be infinite. The solution described herein addresses many problems presented by future high speed I/O applications, and enables minimum S/G ratios to be maintained with acceptable distortion.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A socket comprising:
   a base;
   a plurality of signal contacts disposed within the base; and
   a grounding fence disposed within the base, the grounding fence laterally isolating signal contact pairs from one another to support differential signaling and laterally isolating individual contacts from one another to support single-ended signaling, the signaling to occur between a semiconductor package connected to the socket and a printed wiring board (PWB) connected to the socket.

2. The socket of claim 1 wherein the grounding fence includes:
   a plurality of electrically conductive wall members; and
   an interconnection structure coupled to one or more of the wall members, the interconnection structure enabling electrical contact between the grounding fence and a ground plane of the PWB;
   said wall members having surfaces defining a plurality of contact apertures such that the contact apertures encompass the signal contacts.

3. The socket of claim 2 wherein each contact aperture encompasses at least one of the signal contacts such that the grounding fence supports single-ended signaling.

4. The socket of claim 2 wherein each contact aperture encompasses at least two of the signal contacts such that the grounding fence supports differential signaling.

5. The socket of claim 2 wherein the plurality of contact apertures includes:
   a first set where each contact aperture in the first set encompasses at least one of the signal contacts; and
   a second set where each contact aperture in the second set encompasses at least two of the signal contacts.

6. The socket of claim 2 wherein the interconnection structure includes a plurality of metal feet extending from a board side of the grounding fence.

7. The socket of claim 6 wherein the metal feet have a spacing that is less than a quarter wavelength of a predetermined operating frequency.

8. The socket of claim 2, wherein the interconnection structure includes:
   one or more ground contacts disposed within the base; and
   a shorting mechanism coupled to the one or more ground contacts and at least one of the wall members.

9. The socket of claim 2, wherein the interconnection structure includes:
   a ground plane shunt; and
   a shorting mechanism coupled to the ground plane shunt and at least one of the wall members.

10. The socket of claim 9 wherein the socket has an infinite signal pin to ground pin ratio.

11. The socket of claim 1 wherein the base includes surfaces defining a clearance aperture, the clearance aperture providing clearance space for capacitors coupled to an adjacent semiconductor package.

12. A socket comprising:
    a base;
    a plurality of signal contacts disposed within the base; and
    a grounding fence disposed within the base, the grounding fence laterally isolating pairs of signal contacts from one another to support differential signaling and laterally isolating individual contacts from one another to support single-ended signaling, the signaling to occur between an adjacent semiconductor package and an adjacent printed wiring board (PWB);
    wherein the grounding fence includes a plurality of electrically conductive wall members and an interconnection structure coupled to one or more of the wall members, the interconnection structure enabling electrical contact between the grounding fence and a ground plane of the PWB;
    said wall members having surfaces defining a plurality of contact apertures such that the contact apertures encompass the signal contacts, and the interconnection structure including a plurality of metal feet extending from a board side of the grounding fence, the metal feet have a spacing that is less than a quarter wavelength of a predetermined operating frequency.

13. A socket comprising:
    abase;
    a plurality of signal contacts disposed within the base; and
    at least one grounding fence disposed within the base, the at least one grounding fence laterally isolating signal contact pairs from one another to support differential signaling and laterally isolating individual contacts from one another to support single-ended signaling, the signaling to occur between a semiconductor package coupled to the socket and a board coupled to the socket.

* * * * *